(12) United States Patent
Pai et al.

(10) Patent No.: US 12,113,000 B2
(45) Date of Patent: Oct. 8, 2024

(54) LEAD ADAPTERS FOR SEMICONDUCTOR PACKAGE

(71) Applicant: Infineon Technologies AG, Neubiberg (DE)

(72) Inventors: Ajay Poonjal Pai, Unterhaching (DE); Tino Karczewski, Sinzing (DE); Adrian Lis, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 195 days.

(21) Appl. No.: 17/540,673

(22) Filed: Dec. 2, 2021

(65) Prior Publication Data

US 2023/0178460 A1 Jun. 8, 2023

(51) Int. Cl.
*H01L 23/495* (2006.01)
*H01L 23/31* (2006.01)
*H01L 25/07* (2006.01)
*H01L 25/18* (2023.01)

(52) U.S. Cl.
CPC .. *H01L 23/49555* (2013.01); *H01L 23/49517* (2013.01); *H01L 25/072* (2013.01); *H01L 25/18* (2013.01); *H01L 23/3121* (2013.01)

(58) Field of Classification Search
None
See application file for complete search history.

(56) References Cited

U.S. PATENT DOCUMENTS

| | | | |
|---|---|---|---|
| 10,566,713 B2 | 2/2020 | Chang et al. | |
| 2012/0306091 A1* | 12/2012 | Stolze | H01L 24/24 29/842 |
| 2014/0299982 A1* | 10/2014 | Minamio | H01L 25/162 257/786 |
| 2020/0035579 A1 | 1/2020 | Hoegerl et al. | |
| 2020/0035580 A1 | 1/2020 | Hoegerl et al. | |
| 2020/0035581 A1 | 1/2020 | Hoegerl et al. | |

* cited by examiner

*Primary Examiner* — Michelle Mandala
*Assistant Examiner* — Jordan M Klein
(74) *Attorney, Agent, or Firm* — Murphy, Bilak & Homiller, PLLC (57) ABSTRACT

A semiconductor package includes a first semiconductor die, an encapsulant body of electrically insulating mold compound that encapsulates the first semiconductor die, a plurality of power leads that protrude out of the encapsulant body and form power connections with the first semiconductor die, and a signal lead that protrudes out of the encapsulant body and forms a signal connection with the first semiconductor die, wherein the signal lead comprises a lead adapter retention feature that is configured to form an interlocked connection with a lead adapter that is fitted over an outer end of the signal lead.

20 Claims, 8 Drawing Sheets

LEAD ADAPTERS FOR SEMICONDUCTOR PACKAGE

BACKGROUND

Many different applications such as automotive and industrial applications utilize power modules that comprise multiple power devices in a single package or housing. Power modules may include power conversion circuits such as single and multi-phase half-wave rectifiers, single and multi-phase full-wave rectifiers, voltage regulators, inverters, etc. Modern power modules are designed for minimal power losses and can improve the energy efficiency of a power system. Power modules can form part of power efficient solutions to reduce or prevent anthropogenic emissions of greenhouse gases. For instance, hybrid electric vehicles (HEVs) or electric vehicles (EVs) utilize power modules to perform power conversion, inversion, switching, etc., in a power efficient manner.

As power modules become more ubiquitous in a variety of settings, standardized power module solutions are desirable. In particular, there is a desire to manufacture power modules at high volumes using inexpensive techniques, such as molded package constructions. However, different end-user applications require customized package constructions. For example, end user assemblies may have different socket arrangements, pin length, lead bending position, connector configurations, etc. Adapting a molded package design to a specific end-user assembly requires retooling of the equipment used to form the package. This makes the advantageous efficiency gains realized by modern power modules more difficult to obtain and in some cases cost prohibitive.

SUMMARY

Those skilled in the art will recognize additional features and advantages upon reading the following detailed description, and upon viewing the accompanying drawings.

A semiconductor package is disclosed. According to an embodiment, the semiconductor package comprises a first semiconductor die, an encapsulant body of electrically insulating mold compound that encapsulates the first semiconductor die, a plurality of power leads that protrude out of the encapsulant body and form power connections with the first semiconductor die, and a signal lead that protrudes out of the encapsulant body and forms a signal connection with the first semiconductor die, wherein the signal lead comprises a lead adapter retention feature that is configured to form an interlocked connection with a lead adapter that is fitted over an outer end of the signal lead.

Separately or in combination, the signal lead comprises a first outer face that extends towards the outer end of the signal lead, wherein lead adapter retention feature comprises an engagement surface that is spaced apart from the outer end of the signal lead and forms an angled edge with the first outer face.

Separately or in combination, the engagement surface extends from a wider part of the signal lead to a narrower part of the signal lead, and wherein the wider part of the signal lead is arranged between the outer end of the signal lead and the lead adapter retention feature.

Separately or in combination, the first outer face is an outer surface of the narrower part of the signal lead, and wherein the engagement surface forms a step-shaped transition between the narrower part of the signal lead and the wider part of the signal lead.

Separately or in combination, the wider part of the signal lead is a cylindrically shaped end structure that laterally extends past the narrower part of the signal lead in every direction.

Separately or in combination, the wider part of the signal lead is a winged end structure that projects away from the narrower part of the signal lead in two opposing directions.

Separately or in combination, the first outer face is an outer surface of the wider part of the signal lead, and wherein the lead adapter retention feature comprises a notch in the wider part of the signal lead, and wherein the engagement surface is an interior surface of the notch.

Separately or in combination, the angled edge of the engagement surface is substantially perpendicular with the first outer face, and wherein the notch further comprises a second interior surface that forms an oblique angle with the first outer face and intersects with the engagement surface at a nadir of the notch.

Separately or in combination, the notch further comprises a second interior surface that intersects with the engagement surface at a nadir of the notch, and wherein the engagement surface and the second interior surface are each form an oblique angle with the first outer face.

Separately or in combination, the semiconductor package further comprises a second semiconductor die and a second signal lead, wherein the first and second semiconductor dies are each power transistor dies, wherein the first and second semiconductor dies are configured as a half-bridge circuit, wherein the power leads are configured as power connections to the half-bridge circuit, and wherein the first and second signal leads form signal connections to the half-bridge circuit.

A semiconductor device assembly is disclosed. According to an embodiment, the semiconductor device assembly comprises a first semiconductor die, an encapsulant body of electrically insulating mold compound that encapsulates the first semiconductor die, a plurality of power leads that protrude out of the encapsulant body and form power connections to the first semiconductor die, and a signal lead that protrudes out of the encapsulant body and forms a signal connection with the first semiconductor die, a signal lead adapter comprising a sleeve that is configured to be fitted over an outer end of the signal lead, and wherein the signal lead comprises a signal lead adapter retention feature that is configured to engage with the signal lead adapter so as to reach an interlocked position as the sleeve is fitted over an outer end of the signal lead.

Separately or in combination, the signal lead comprises a first outer face that extends towards the outer end of the signal lead, wherein lead adapter retention feature comprises an engagement surface that forms an angled edge with the first outer face, wherein an interior region of the sleeve comprises a second engagement surface, and wherein the second engagement surface of the signal lead adapter and the engagement surface of the signal lead adapter retention feature mutually oppose one another in the interlocked position.

Separately or in combination, the engagement surface of the lead adapter retention feature forms a step-shaped transition between a wider part and a narrower part of the signal lead, and wherein the sleeve is configured to be fitted over the wider part until the signal lead adapter reaches the interlocked position.

Separately or in combination, the signal lead adapter retention feature comprises a notch in the first outer face of the signal lead, wherein the signal lead adapter comprises a protrusion that is correspondingly shaped as the notch, and wherein the notch comprises the engagement surface of the signal lead adapter retention feature, and wherein the protrusion comprises the second engagement surface of the signal lead adapter.

Separately or in combination, the signal lead adapter further comprises a mating interface that extends past the outer end of the signal lead when the signal lead adapter is in the interlocked position, and wherein the mating interface is configured to mate with and form an electrical connection with a circuit board connection pin.

Separately or in combination, the mating interface is any one of: a cylindrical sleeve that is configured to insertably receive the circuit board connection pin, a planar mating surface that is configured to be welded or soldered to a corresponding planar surface of the circuit board connection pin, and a fastener receptacle that is configured to align with a corresponding fastener receptacle from the circuit board connection pin.

Separately or in combination, the semiconductor device assembly further comprises a plurality of power lead adapters that are each configured to be mated with and form an electrical connection to one of the power leads.

Separately or in combination, the power lead adapters each comprise a mating interface, wherein the mating interface comprises a sleeve that is configured to be fitted over the one of the power leads, or a planar tab that is configured to be welded to the one of the power leads.

Separately or in combination, the semiconductor package further comprises a second semiconductor die, wherein the first and second semiconductor dies are each power transistor dies, wherein the first and second semiconductor dies are configured as a half-bridge circuit, wherein the power leads are configured as power connections to the half-bridge circuit, and wherein the signal lead is configured as a signal connection to the half-bridge circuit.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A and 1B, illustrates a semiconductor package, according to an embodiment.

FIG. 3, which includes

FIG. 4, which includes

FIG. 5, which includes

FIG. 7, which includes

FIG. 8, which includes FIGS. 8A and 8B, illustrates a semiconductor package and power lead adapters that are configured to mate with power leads of the semiconductor package.

DETAILED DESCRIPTION

Embodiments of a semiconductor package and lead adapters that advantageously make the semiconductor package to be compatible with a variety of different end user configurations are disclosed herein. The lead adapters are designed to be fitted over outer ends of the package leads to quickly and reliably form a mechanically interlocked connection. The lead adapters can be configured provide a variety of different lead arrangements for the semiconductor package, such as different lead lengths, lead bending arrangements, etc. Moreover, the lead adapters can be mated with different types of circuit board connection elements such as wires, pins, busbars, etc. This allows for one standardized semiconductor package to be used in a variety of different systems, with the only difference being the particular lead adapters and/or circuit board connection elements used to complete the assembly. The lead adapters therefore enable high-volume production of a universalized semiconductor package configuration at low cost, wherein the provision of different lead adapters and/or circuit board connection elements is significantly less expensive than customization of the semiconductor package itself.

Figure 1A:
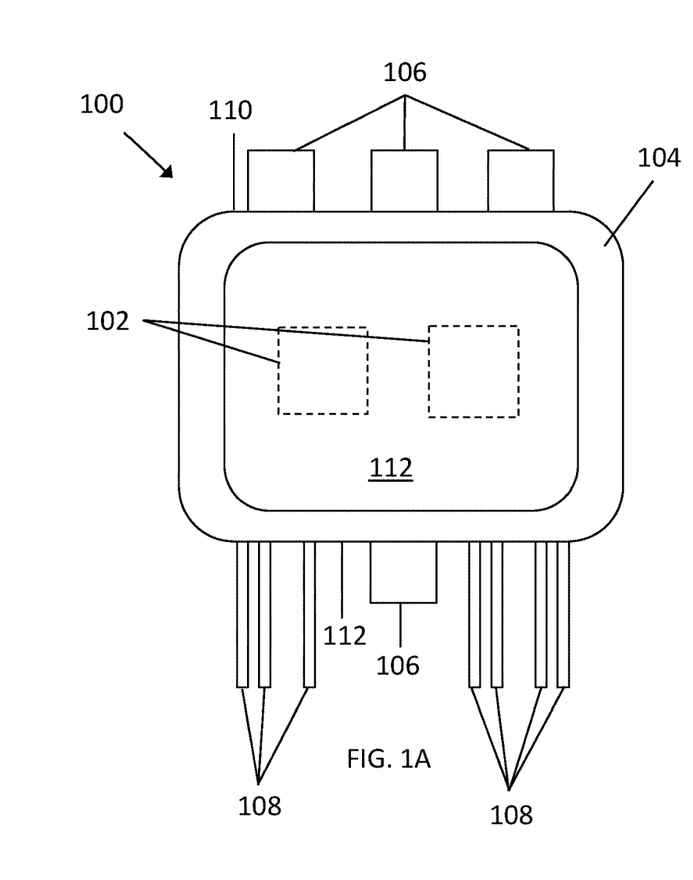
FIG. 1A illustrates a plan-view of the semiconductor package.
Figure 1B:
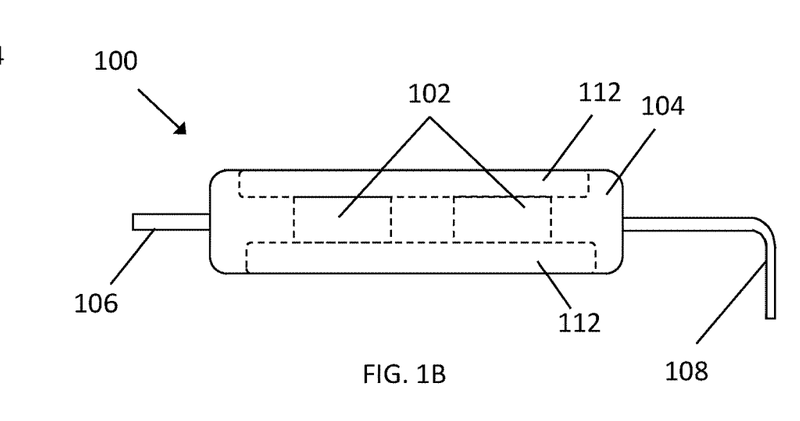
FIG. 1B illustrates a side-view of the semiconductor package.

Referring to FIG. 1, a semiconductor package 100 is depicted, according to an embodiment. The semiconductor package 100 comprises first and second semiconductor dies 102. Generally speaking, the first and second semiconductor dies 102 can be formed in a wide variety of device technologies that utilize a wide variety of semiconductor materials. Examples of such materials include, but are not limited to, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), etc.

According to an embodiment, the first and second semiconductor dies 102 are each configured as discrete power devices that are rated to accommodate voltages of at least 100 V (volts), e.g., voltages of 600 V, 1200 V or more and/or are rated to accommodate currents of at least 1 A, e.g., currents of 10 A, 50 A, 100 A or more. For example, the first and second semiconductor dies 102 can each be configured as discrete power transistor dies, for example MOSFETs (Metal Oxide Semiconductor Field Effect Transistors), IGBTs (Insulated Gate Bipolar Transistors), and HEMTs (High Electron Mobility Transistors), etc. One or both of the first and second semiconductor dies 102 may be configured as vertical devices, which refers to a device that conducts a load current between opposite facing main and rear surfaces of the die. Alternatively, one or both of the first and second semiconductor dies 102 may be configured as lateral devices, which refers to a device that conducts a load current parallel to a main surface of the die.

The semiconductor package 100 comprises an encapsulant body 104 of electrically insulating mold compound that encapsulates the first and second semiconductor dies 102. The encapsulant body 104 can be formed by a molding process such as injection molding, transfer molding, compression molding, etc. According to these techniques, a lead frame assembly comprising the first and second semiconductor dies 102 is arranged into a molding tool the mold compound is injected into the molding tool and is subsequently cured to form the encapsulant body 104. Generally speaking, the mold compound can comprise dielectric materials such as epoxy, thermosetting plastic, polymer, resin, etc.

The semiconductor package 100 comprises a plurality of power leads 106 that protrude out of the encapsulant body 104. The power leads 106 form power connections to the semiconductor dies 102. The power connections refer to those connections that accommodate the rated blocking voltage and switching current of the semiconductor dies 102. For example, the power leads 106 may be connected to the source and drain terminals of the first and second semiconductor dies 102 in the case of a MOSFET, or may be connected to emitter and collector of the first and second semiconductor dies 102 in the case of an IGBT, and so forth. The semiconductor package 100 may comprise internal interconnect elements such as metal clips, substrate, ribbons, etc., between the power leads 106 and the semiconductor dies 102 to effectuate the power connections. As shown, the semiconductor package 100 comprises a group of three of the power leads 106 that extend away from a first side 110 of the encapsulant body 104. These power leads 106 may be the leads that provide a fixed voltage, such as a positive potential ($+V_{DD}$), negative potential ($-V_{SS}$), reference potential (GND), to the first and second semiconductor dies 102. Additionally as shown, the semiconductor package 100 comprises fourth one of the power leads 106 that extends away from a second side 112 of the encapsulant body 104 opposite from the first side 110 of the encapsulant body 104. This fourth one of the power leads 106 may be the lead that provides an output or load terminal of the semiconductor package 100.

The semiconductor package 100 comprises a plurality of signal leads 108 that protrude out of the second side 112 of the encapsulant body 104. The signal leads 108 form signal connections to the first and second semiconductor dies 102. The signal connections refer to those connections that do not accommodate the rated current and voltage supplied to or from the semiconductor dies 102. For example, the signal leads 108 may be connected to the gate terminals of the semiconductor dies 102. Moreover, the signal leads 108 may be connected to the load terminals of the semiconductor dies 102, e.g., the source/emitter, collector/drain, etc., wherein the signal leads 108 are configured as measurement terminals, e.g., source/emitter current sense, collector/drain current sense, temperature sense, etc. The semiconductor package 100 may comprise internal interconnect elements such as metal clips, bond wires, etc., between the signal leads 108 and the semiconductor dies 102 to effectuate the signal connections.

According to an embodiment, the semiconductor package 100 is configured such that the first semiconductor die 102 and the second semiconductor die 102 are configured as a half-bridge circuit. A half-bridge circuit refers to one type of circuit topology that forms a power conversion circuit, such as a DC to DC converter, DC to AC converter, etc. A half-bridge circuit comprises a high-side switch connected in series with a low-side switch. A half-bridge circuit performs power conversion by successively switching the high-side switch and the low-side switch according to a power control scheme (e.g., pulse width modulation) to produce a desired voltage and frequency an output or phase terminal of the half-bridge circuit. In this case, the group of three of the power leads 106 that extend away from the first side 110 of the encapsulant body 104 may provide the fixed voltage connections to the half-bridge circuit, and the power lead 106 that extends away from the second side 112 of the encapsulant body 104 may provide the output connection of the half-bridge circuit. Additionally, the signal leads 108 form signal connections to the half-bridge circuit, e.g., the gate connections to the high-side switch and the low-side switch as well as measurement connections to the various nodes of the half-bridge circuit.

According to an embodiment, the semiconductor package 100 is configured as a power module. A power module refers to a type of semiconductor device that comprises multiple power devices incorporated therein and has the necessary electrical interconnect and cooling capacity to accommodate the high power operation of these devices. In one particular example, the semiconductor package 100 may be configured as a double-sided cooling power module. In that case, the semiconductor package 100 comprises thermally conductive cooling substrates such as metal die pad structures that are thermally coupled to the semiconductor dies 102 extending to opposite sides of the encapsulant body 104. For example, the semiconductor package 100 may have an exposed die pad 112 on opposite facing sides of the encapsulant body 104, as shown in FIG. 1. In the final assembly, both of the die pads 112 can be thermally coupled to a cooling apparatus, such as a heat sink. Internally, the semiconductor package 100 may comprise structured substrates which act as the cooling structures along with conductive spacers to effectuate the necessary electrical connections of a power converter circuit. An example of a double-sided cooling power module having these features is disclosed in U.S. Pat. No. 11,004,764 to Hoegerl et al., and U.S. Pat. No. 11,018,072 to Hoegerl et al., the content of each document being incorporated by reference herein in their entirety.

Figure 2:
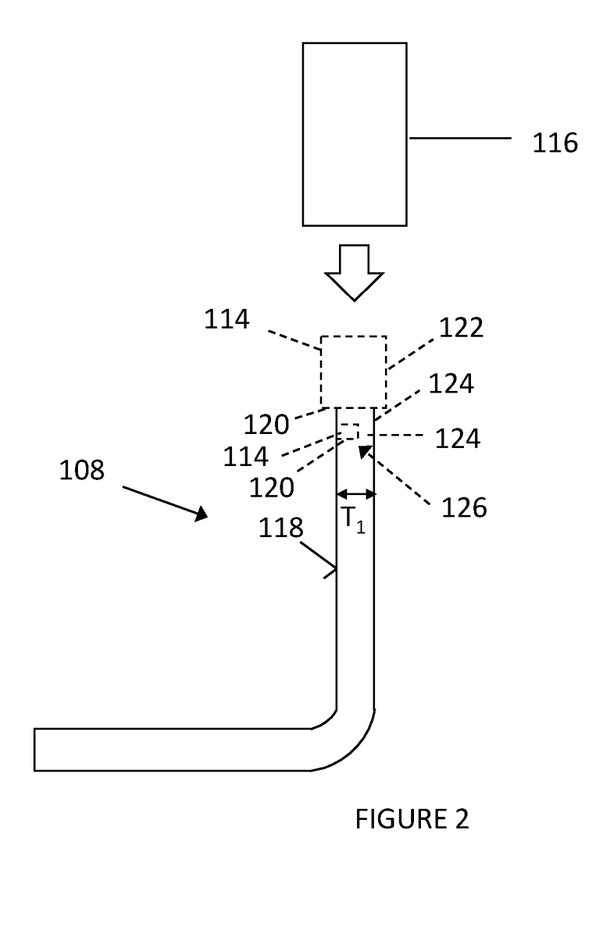
FIG. 2 schematically illustrates a package lead comprising a lead adapter retention feature and a lead adapter that forms an interlocked connection with the lead adapter retention feature, according to an embodiment.

Referring to FIG. 2, at least one of the signal leads 108 of the semiconductor package 100 comprises a lead adapter retention feature 114. The lead adapter retention feature 114 is configured to form an interlocked connection with a lead adapter 116 that is fitted over an outer end of the signal lead 108. That is, the lead adapter retention feature 114 is an intentionally formed feature of the signal lead 108 that is arranged to mate with a physical feature from a lead adapter 116 in an interlocking manner. In the interlocked position, the lead adapter retention feature 114 and the lead adapter 116 engage by the fitting together of projections and recesses that overlap with one another. The lead adapter retention feature 114 is an electrically conductive structure comprising, e.g., copper, aluminum, etc. and alloys thereof, that is configured to mate with a carrier interconnect structure, such as the connection pin 134 as will be described in further detail below with reference to FIG. 7. The interlocked connection between the lead adapter retention feature 114 and the lead adapter 116 forms a reliable electrical connection between the two structures that can be effectuated without the use of heat and/or intermediate adhesives, as would be used in the case of metal joining techniques such as soldering, welding, brazing, sintering, conductive glue, etc. The interlocked connection can be realized by mechanical force, e.g., by hand or by processing equipment, that is below the tensile strength (breaking point) of the lead adapter 116 and the signal lead 108.

The signal lead 108 comprises a first outer face 118 that extends towards the outer end of the signal lead 108. The first outer face 118 may be a substantially planar surface of the signal lead 108. For example, the signal lead 108 can have a cubic geometry, wherein the first outer face 118 corresponds to one of the faces of the cube. More generally, the signal lead 108 can have a variety of cross-sectional geometries, and the first outer face 118 can be any outer side of the signal lead 108 to which an angled edge may be formed in. The lead adapter retention feature 114 comprises an engagement surface 120 that is spaced part from the outer end of the signal lead 108. The engagement surface 120 forms an angled edge with the first outer face 118. That is, the engagement surface 120 is a surface that intersects with the first outer face 118 at an angle, thereby forming an engagement plane that is transverse to the plane of the first outer face 118. The angled edge between the engagement surface 120 and the first outer face 118 may run transverse to the movement direction of the signal lead adapter 116 shown in FIG. 2 so that the signal lead adapter 116 can be slid past the angled edge and form the interlocked connection.

According to an embodiment, the engagement surface 120 of the lead adapter retention feature 114 results from a lead configuration whereby the signal lead 108 comprises a wider part 122 and a narrower part 124. In these embodiments, the widths of the wider part 122 and narrower part 124 are each measured in a cross-sectional direction that is perpendicular to the length direction of the signal lead 108. In this context, the wider part 122 and narrower part 124 refer to relative differences in lead thickness, and are not necessarily the widest or narrowest parts of the signal lead 108, as the case may be. The wider part 122 of the signal lead 108 is arranged between the outer end of the signal lead 108 and the lead adapter retention feature 114. The wider part 122 may extend to the outer end of the signal lead 108 or may correspond to a locally wider portion that is not necessarily at the outer end of the signal lead 108.

FIG. 2 schematically depicts two possible lead configurations whereby the signal lead 108 comprises a wider part 122 and a narrower part 124, and the engagement surface 120 results therefrom. In a first possible configuration that is schematically illustrated in FIG. 2, the signal lead 108 has a baseline thickness $T_1$, i.e., a thickness throughout most of the length of the signal lead 108, and the wider part 122 corresponds to a section of the signal lead 108 that is disposed at the outer end of the signal lead 108 which has a greater thickness than the baseline thickness $T_1$. In that case, the engagement surface 120 forms a step-shaped transition between the narrower part 124 of the signal lead 108 and the wider part 122 of the signal lead 108. In a second possible configuration, the signal lead 108 has a baseline thickness $T_1$, and the lead adapter retention feature 114 is formed by a notch 126 in the part of the signal lead 108 having the baseline thickness $T_1$. In that case, the engagement surface 120 is an interior surface of the notch 126 formed in the signal lead 108.

Referring to FIG. 3, the lead adapter 116 is shown being arranged over the outer end of the signal lead 108 and in the interlocked position, according to different embodiments. In each case, the lead adapter 116 comprises a sleeve 128 that is configured to be fitted over an outer end of the signal lead 108. The dimensions of the sleeve 128 are such that the lead adapter 116 can be slid downward in the direction shown in FIG. 2. An interior region of the sleeve 128 comprises a second engagement surface 130. The engagement surface 120 of the lead adapter 116 has a complementary geometry as the second engagement surface 130 from the sleeve 128 such that the engagement surface 120 of the lead adapter 116 and the second engagement surface 130 from the sleeve 128 mutually oppose one another in the interlocked position. As can be seen in the figure, the wider part 122 of the signal lead 108 must slide through the sleeve 128 until the second engagement surface 130 from the sleeve 128 is arranged underneath the engagement surface 120 of the lead adapter 116. Thus, the lead adapter 116 may have a material composition that permits it to flex outward to enable this interlocking without breaking.

Figure 3A:
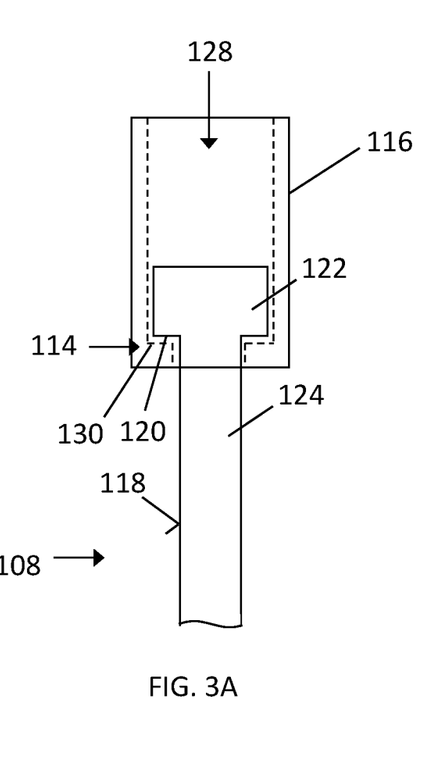
FIGS. 3A and 3B, illustrates a lead adapter in an interlocked connection with a lead adapter retention feature, according to two different embodiments.

FIG. 3A illustrates a configuration wherein the engagement surface 120 of the signal lead 108 forms a step-shaped transition between the wider part 122 of the signal lead 108 and a narrower part 124. In this case, the first outer face 118 is an outer surface of the narrower part 124 of the signal lead 108. The interior surfaces of the sleeve 128 have a shelf geometry, wherein an upper surface of the shelf corresponds to the second engagement surface 130.

Figure 3B:
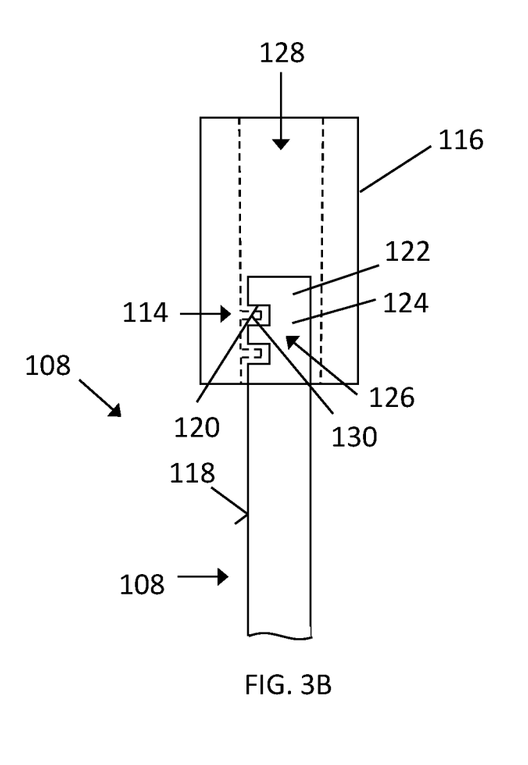

FIG. 3B illustrates a configuration wherein the signal lead adapter retention feature 114 comprises a notch 126 in the first outer face 118 of the signal lead 108. In this case, the first outer face 118 is an outer surface of the wider part 122 of the signal lead 108. The interior surfaces of the sleeve 128 comprise a protrusion that comprises the second engagement surface 130 and engages with the notch 126 in the interlocked position.

FIG. 4 illustrates two particular configurations for a signal lead comprising the signal lead retention feature 114. In each case, the first outer face 118 is an outer surface of the narrower part 124 of the signal lead 108, and the engagement surface 120 forms a step-shaped transition between the narrower part 124 of the signal lead 108 and the wider part 122 of the signal lead 108.

Figure 4A:
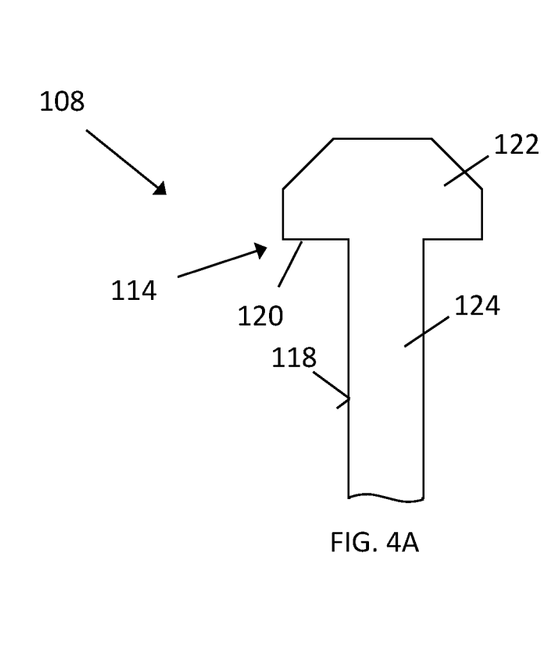
FIGS. 4A and 4B, illustrates a package lead with a lead adapter retention feature, according to two different embodiments.

In the example of FIG. 4A, the wider part 122 of the signal lead 108 forms a winged end structure of the signal lead 108. The winged end structure comprises two wing parts that project away from the narrower part 124 of the signal lead 108 in two opposing directions. Meanwhile, the signal lead 108 can have the same thickness in one direction, i.e., the cross-sectional direction perpendicular to the view of FIG. 4A.

Figure 4B:
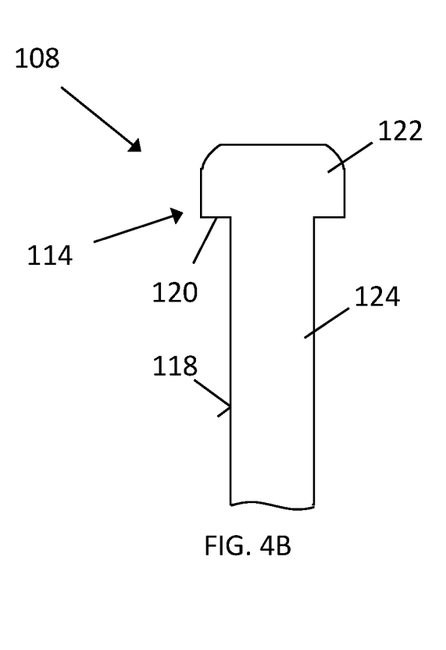

In the example of FIG. 4B, the wider part 122 of the signal lead 108 comprises a cylindrically shaped end structure. The cylindrically shaped end structure laterally extends past the narrower part 124 of the signal lead 108 in every direction. That is, the wider part 122 may also extend outward in a similar manner as the view of FIG. 4A in a cross-sectional direction that is perpendicular to the view of FIG. 4A. As a result, the end of the signal lead 108 resembles that of a fastener, such as a rivet, nail, bolt, etc.

FIG. 5 illustrates two particular configurations for a signal lead 108 comprising the signal lead retention feature 114. In each case, the first outer face 118 is an outer surface of the wider part 122 of the signal lead 108, and the lead adapter retention feature 114 is realized by a notch 126 in the wider part 122 of the signal lead 108. The engagement surface 120 forms a interior surface of the notch 126, and the notch 126 comprises a second interior surface 132 that intersects the engagement surface 120 at a nadir of the notch 126 and additionally forms an angled edge with the first outer face 118 of the signal lead 108.

Figure 5A:
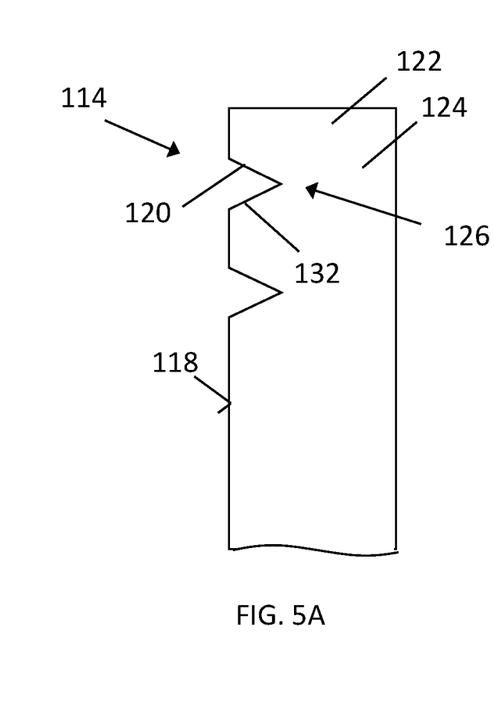
FIGS. 5A and 5B, illustrates a package lead with a lead adapter retention feature, according to two different embodiments.

In the example of FIG. 5A, the engagement surface 120 and the second interior surface 132 of the notch 126 each form an oblique angle with the first outer face 118. Thus, the notch 126 has a v-shaped geometry with respect to the first outer face 118.

Figure 5B:
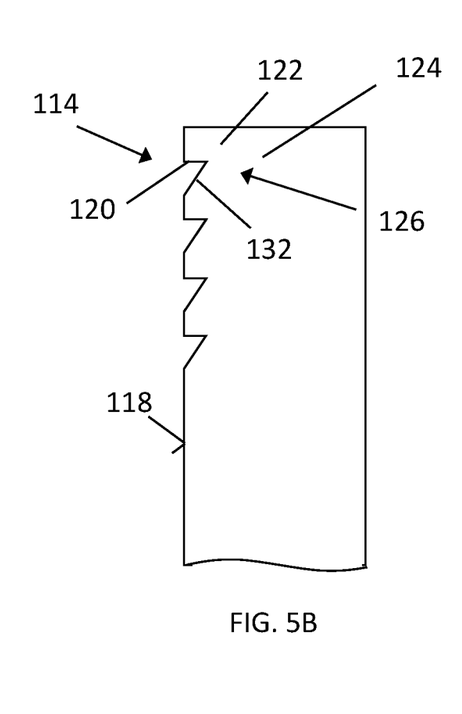

In the example of FIG. 5B the angled edge of the engagement surface 120 is substantially perpendicular with the first outer face 118, and thus the engagement surface 120 is substantially perpendicular with the first outer face 118. The second interior surface 132 of the notch 126 forms an oblique angle with the first outer face 118. Thus, the notch 126 has a sawtooth geometry with respect to the first outer face 118.

In the case that the semiconductor package 100 comprises multiple ones of the signal leads, a lead adapter retention feature 114 may be provided on any number of the signal leads 108. For example, in the above-described example wherein the semiconductor package 100 is configured as a power module, each of the signal leads 108 may comprise one or more of the lead adapter retention features 114 as described herein. As between multiple ones of the signal leads 108, the lead adapter retention features 114 may be the same as one another or may be different from one another.

Figure 6:
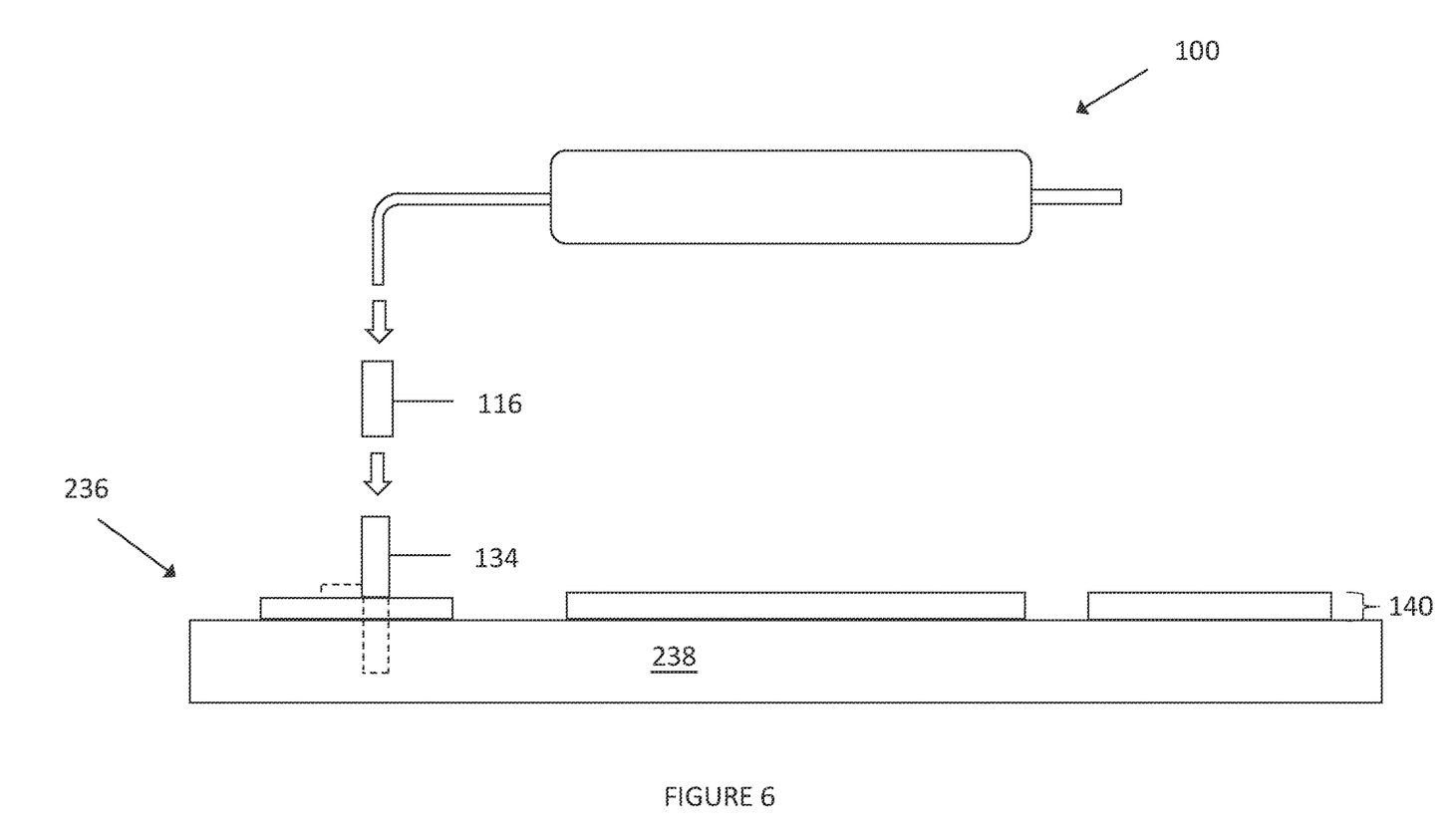
FIG. 6 illustrates an assembly comprising a circuit board, a semiconductor package, circuit board connection pins, and lead adapters that provide a mechanical and electrical connection between package leads from the semiconductor package and bond pads from the circuit board, according to an embodiment.

Referring to FIG. 6, an assembly comprising the semiconductor package 100, a plurality of the signal lead adapters 116, a plurality of connection pins 134, and a circuit carrier 236 is depicted, according to an embodiment.

The circuit carrier 236 is an electronics carrier that is configured to accommodate the mounting of multiple power semiconductor devices thereon and to accommodate electrical connections between these devices. According to an embodiment, the circuit carrier 236 is PCB (printed circuit board). In that case, the circuit carrier 236 may comprise a substrate 238 of laminate material (e.g., FR-4) and a structured metallization layer 140 disposed on the substrate 238. According to another embodiment, the circuit carrier 236 is a power electronics substrate, such as a DBC (direct bonded copper) substrate, an AMB (active metal brazed) substrate, or an IMS (insulated metal substrate) substrate. In that case, the circuit carrier 236 may comprise a substrate 238 of ceramic material such as $Al_2O_3$ (Alumina) AlN (Aluminium Nitride), etc., and a structured metallization layer 140 disposed on the substrate 238.

The connection pins 134 are electrically conductive structures that form electrical connections with the structured metallization layer 140 from the circuit carrier 236. The connection pins 134 may comprise an electrically conductive metal, such as copper, aluminum, etc. and alloys thereof. The connection pins 134 can be substantially rigid structures that are inserted through corresponding receptacles in the circuit carrier 236, e.g., in a similar manner as a through-hole type package lead. Alternatively, the connection pins 134 can be wire-like structures that are bonded to the circuit carrier 236, e.g., by a wire bonding process. In yet another embodiment, the connection pins 134 may be metal clips that are attached to the circuit carrier 236, e.g., by a soldering or sintering process.

The assembly comprising the lead adapters 116 and the connection pins 134 allow for the semiconductor package 100 to be mounted on and electrically connected to the circuit carrier 236 without requiring the lead configuration of the semiconductor package 100 to be specifically compatible with the mounting footprint of the circuit carrier 236. The adaptation of a semiconductor package 100 to a particular specific mounting footprint may occur through customization and/or selection of the lead adapters 116, the connection pins 134, or both. For instance, a manufacturer may produce the semiconductor package 100 having the lead adapter retention features 114 and make commercially available a variety of signal lead adapters 116 with different dimensions and/or mating interface configurations. Alternatively, a manufacturer may produce the semiconductor package 100 having the lead adapter retention features 114 and an end user may produce compatible pairs of the lead adapters 116 and connection pins 134 to make the semiconductor package 100 compatible with the circuit carrier 236.

Referring to FIG. 7, the signal lead adapters 116 and the connection pins 134 each comprise a mating interface 136. The mating interface 136 of the signal lead adapters 116 and the mating interface 136 of the connection pin 134 are configured to mate with one another, thus forming a mechanical and electrical connection between signal leads 108 and the connection pins 134. The mating interface 136 of the signal lead adapters 116 extends past the outer end of the signal lead 108 (not shown in FIG. 7) when the signal lead adapter 116 is in the interlocked position, and is therefore accessible for mating with the connection pins 134. The mating interface 136 of the connection pins 134 is disposed at or near an end of the connection pin 134 that is opposite from the end which is attached to or inserted in the circuit carrier 236, and is therefore accessible for mating with the lead adapters 116.

Figure 7A:
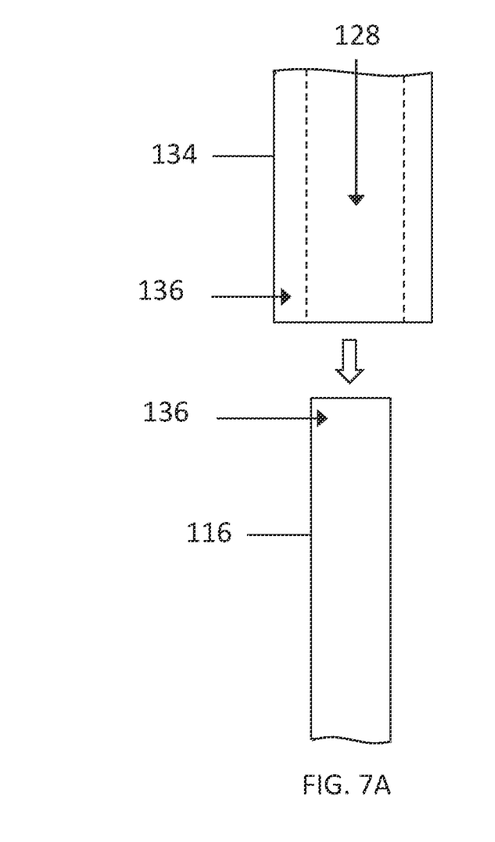
FIGS. 7A, 7B and 7C, illustrates mating interfaces of lead adapters and circuit board connection pins, according to three different embodiments.

In the example of FIG. 7A, the mating interface 136 of the signal lead adapter 116 comprises a cylindrical sleeve 128. The cylindrical sleeve 128 is dimensioned to receive a correspondingly shaped end part of the connection pins 134 and form a secure connection. As shown, the connection pin 134 may be configured as a metal post or wire-like structure wherein the mating interface 136 of the connection pin 134 corresponds to an unaltered end part of the connection pin 134. When inserted in the sleeve 128, the unaltered end part of the connection pin 134 and the cylindrical sleeve 128 form a mechanical pressure fit that is sufficient to securely retain the signal leads 108 and complete an electrical connection. Alternatively, features such as projections and recesses may be included to enhance mechanical retention.

Figure 7B:
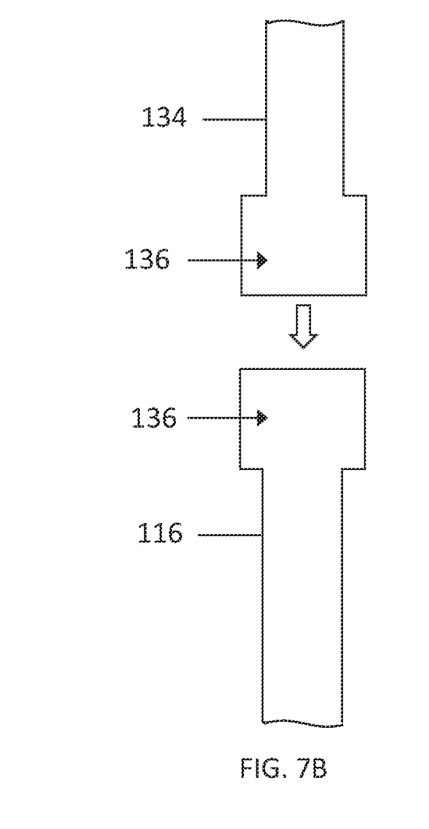

In the example of FIG. 7B, the mating interface 136 of the signal lead adapter 116 is a planar surface and the mating interface 136 of the of the connection pins 134 is a planar surface of roughly comparable size. The mating interfaces 136 of the signal lead adapter 116 and the connection pins 134 can be mechanically or electrically connected to one another by metal joining techniques such as welding, brazing, soldering, sintering, etc.

Figure 7C:
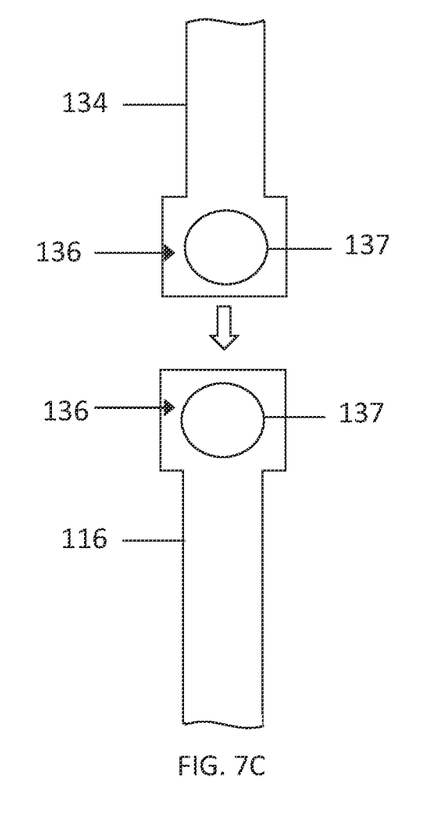

In the example of FIG. 7C, the mating interface 136 of the signal lead adapter 116 comprises a fastener receptacle 137 that is configured to align with a corresponding fastener receptacle 137 from the connection pin 134. A fastener such as a screw, pin or bolt can be inserted through the fastener receptacles 137 of the signal lead adapter 116 and the connection pin 134, thus forming a stable mechanical and electrical connection.

Figure 8A:
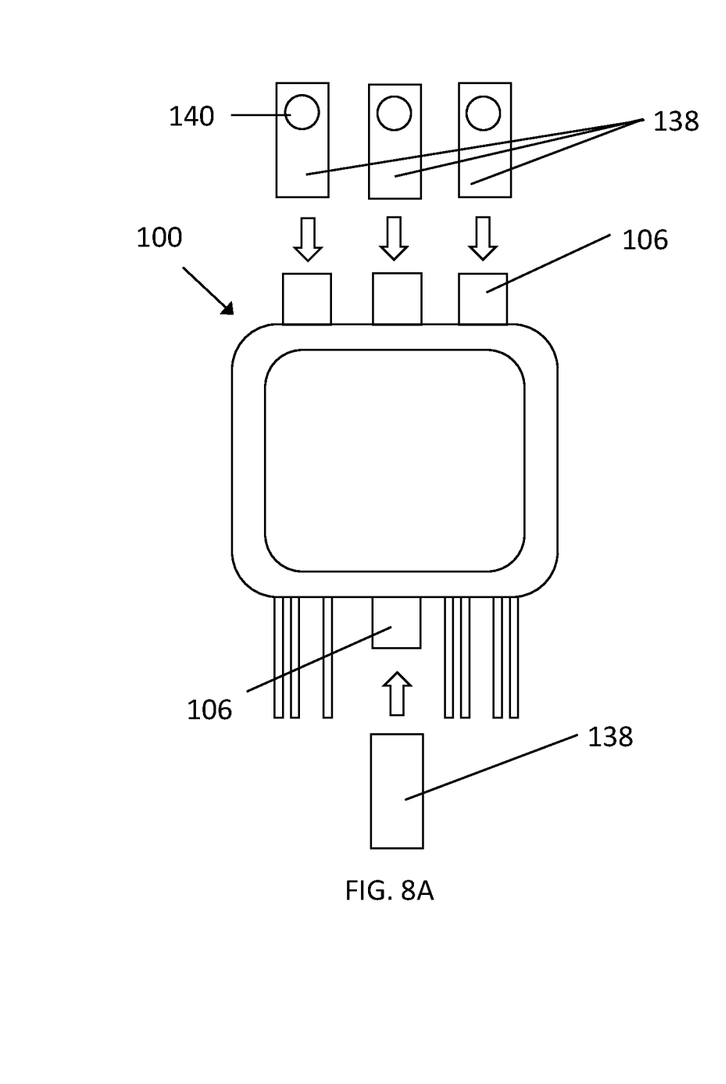
FIG. 8A illustrates the semiconductor package and power lead adapters before mating.

Referring to FIG. 8, the semiconductor assembly may further comprise a plurality of power lead adapters 138. The power lead adapters 138 are electrically conductive structures that may comprise a metal such as copper, aluminum, etc., and alloys thereof. The power lead adapters 138 can each be mated with one of the power leads 106 and form an electrical connection thereto. The power lead adapters 138 may be used to lengthen or adapt the connection footprint of the power leads 106 to be compatible with the power delivery elements of a particular circuit carrier 236. The power leads 106 may comprise perforations 140 that can be secured to a busbar structure, e.g., by a fastener such as a screw, pin or bolt. Alternatively, outer ends of the power lead adapters 138 may be planar structures that can be secured to a corresponding planar metal structure by metal adhesion, e.g., welding, soldering, brazing sintering, etc. As shown, one of the power lead adapters 138 may be provided for any one of the power leads 106. Each of these power lead adapters 138 may differ from one another with respect to geometry, connection mechanism, etc.

Figure 8B:
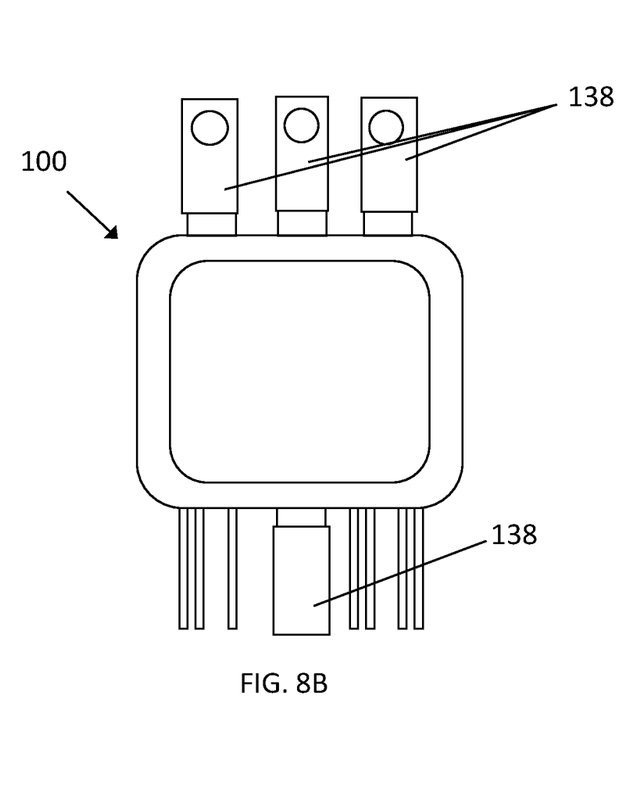
FIG. 8B illustrates the semiconductor package and power lead adapters after mating.

The power lead adapters 138 can be mated with the power leads 106 as shown in FIG. 8B in a variety of different ways. For example, the mating interface of the power lead adapters may comprise a sleeve (not shown) that is fitted over one of the power leads 106 so that the power lead 106 is securely affixed to the power lead adapter 116 by ordinary mechanical force in a similar manner as the previously described sleeve mechanisms. In another embodiment, the mating interface of the power lead adapters 138 is realized by a planar tab of the power lead adapters 138. This planar tab can be pressed against a correspondingly shaped planar surface of the power leads 106, and a mechanical and electrical connection can be effectuated using a metal adhesion technique, e.g., welding, soldering, brazing sintering, etc. This mating technique may be preferred to create a robust connection for very large currents and/or voltages.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor package comprising:
a first semiconductor die;
an encapsulant body of electrically insulating mold compound that encapsulates the first semiconductor die;
a plurality of power leads that protrude out of the encapsulant body and form power connections with the first semiconductor die; and
a signal lead that protrudes out of the encapsulant body and forms a signal connection with the first semiconductor die,
wherein the signal lead comprises a lead adapter retention feature that is configured to form an interlocked connection with a lead adapter that is fitted over an outer end of the signal lead.

2. The semiconductor package of claim 1, wherein the signal lead comprises a first outer face that extends towards the outer end of the signal lead, wherein lead adapter retention feature comprises an engagement surface that is spaced apart from the outer end of the signal lead and forms an angled edge with the first outer face.

3. The semiconductor package of claim 2, wherein the engagement surface extends from a wider part of the signal lead to a narrower part of the signal lead, and wherein the wider part of the signal lead is arranged between the outer end of the signal lead and the lead adapter retention feature.

4. The semiconductor package of claim 3, wherein the first outer face is an outer surface of the narrower part of the signal lead, and wherein the engagement surface forms a step-shaped transition between the narrower part of the signal lead and the wider part of the signal lead.

5. The semiconductor package of claim 4, wherein the wider part of the signal lead is a cylindrically shaped end structure that laterally extends past the narrower part of the signal lead in every direction.

6. The semiconductor package of claim 4, wherein the wider part of the signal lead is a winged end structure that projects away from the narrower part of the signal lead in two opposing directions.

7. The semiconductor package of claim 3, wherein the first outer face is an outer surface of the wider part of the signal lead, and wherein the lead adapter retention feature comprises a notch in the wider part of the signal lead, and wherein the engagement surface is an interior surface of the notch.

8. The semiconductor package of claim 7, wherein the angled edge of the engagement surface is substantially perpendicular with the first outer face, and wherein the notch further comprises a second interior surface that forms an oblique angle with the first outer face and intersects with the engagement surface at a nadir of the notch.

9. The semiconductor package of claim 7, and wherein the notch further comprises a second interior surface that intersects with the engagement surface at a nadir of the notch, and wherein the engagement surface and the second interior surface are each form an oblique angle with the first outer face.

10. The semiconductor package of claim 1, wherein the signal lead is a first signal lead, wherein the semiconductor package further comprises a second semiconductor die and a second signal lead, wherein the first and second semiconductor dies are each power transistor dies, wherein the first and second semiconductor dies are configured as a half-bridge circuit, wherein the power leads are configured as power connections to the half-bridge circuit, and wherein the first and second signal leads form signal connections to the half-bridge circuit.

11. The semiconductor package of claim 1, wherein the lead adapter retention feature is formed by a notch that partially penetrates a thickness of the signal lead.

12. A semiconductor device assembly, comprising:
a semiconductor package comprising a first semiconductor die, an encapsulant body of electrically insulating mold compound that encapsulates the first semiconductor die, a plurality of power leads that protrude out of the encapsulant body and form power connections to the first semiconductor die, and a signal lead that protrudes out of the encapsulant body and forms a signal connection with the first semiconductor die;
a signal lead adapter comprising a sleeve that is configured to be fitted over an outer end of the signal lead, and wherein the signal lead comprises a signal lead adapter retention feature that is configured to engage with the signal lead adapter so as to reach an interlocked position as the sleeve is fitted over an outer end of the signal lead.

13. The semiconductor device assembly of claim 12, wherein the signal lead comprises a first outer face that extends towards the outer end of the signal lead, wherein the signal lead adapter retention feature comprises an engagement surface that forms an angled edge with the first outer face, wherein an interior region of the sleeve comprises a second engagement surface, and wherein the second engagement surface of the signal lead adapter and the engagement surface of the signal lead adapter retention feature mutually oppose one another in the interlocked position.

14. The semiconductor device assembly of claim 13, wherein the engagement surface of the signal lead adapter retention feature forms a step-shaped transition between a wider part and a narrower part of the signal lead, and wherein the sleeve is configured to be fitted over the wider part until the signal lead adapter reaches the interlocked position.

15. The semiconductor device assembly of claim 13, wherein the signal lead adapter retention feature comprises a notch in the first outer face of the signal lead, wherein the signal lead adapter comprises a protrusion that is correspondingly shaped as the notch, and wherein the notch comprises the engagement surface of the signal lead adapter retention feature, and wherein the protrusion comprises the second engagement surface of the signal lead adapter.

16. The semiconductor device assembly of claim 12, wherein the signal lead adapter further comprises a mating interface that extends past the outer end of the signal lead when the signal lead adapter is in the interlocked position, and wherein the mating interface is configured to mate with and form an electrical connection with a circuit board connection pin.

17. The semiconductor device assembly of claim 16, wherein the mating interface is any one of:
 a cylindrical sleeve that is configured to insertably receive the circuit board connection pin;
 a planar mating surface that is configured to be welded or soldered to a corresponding planar surface of the circuit board connection pin; and
 a fastener receptacle that is configured to align with a corresponding fastener receptacle from the circuit board connection pin.

18. The semiconductor device assembly of claim 12, further comprising a plurality of power lead adapters that are each configured to be mated with and form an electrical connection to one of the power leads.

19. The semiconductor device assembly of claim 18, wherein the power lead adapters each comprise a mating interface, wherein the mating interface comprises a sleeve that is configured to be fitted over the one of the power leads, or a planar tab that is configured to be welded to the one of the power leads.

20. The semiconductor device assembly of claim 12, wherein the semiconductor package further comprises a second semiconductor die, wherein the first and second semiconductor dies are each power transistor dies, wherein the first and second semiconductor dies are configured as a half-bridge circuit, wherein the power leads are configured as power connections to the half-bridge circuit, and wherein the signal lead is configured as a signal connection to the half-bridge circuit.

* * * * *

UNITED STATES PATENT AND TRADEMARK OFFICE
CERTIFICATE OF CORRECTION

| | | |
|---|---|---|
| PATENT NO. | : 12,113,000 B2 | Page 1 of 1 |
| APPLICATION NO. | : 17/540673 | |
| DATED | : October 8, 2024 | |
| INVENTOR(S) | : A. Pai et al. | |

It is certified that error appears in the above-identified patent and that said Letters Patent is hereby corrected as shown below:

In the Claims

Column 12, Line 38 (Claim 9), please change "and wherein" to -- wherein --.

Column 12, Line 42 (Claim 9), please change "are each" to -- each --.

Signed and Sealed this
Fifteenth Day of April, 2025

Coke Morgan Stewart
*Acting Director of the United States Patent and Trademark Office*